(12) United States Patent
Schultz et al.

(10) Patent No.: US 7,092,639 B2
(45) Date of Patent: Aug. 15, 2006

(54) EMI SHIELD FOR REDUCING CLOCK JITTER OF A TRANSCEIVER

(75) Inventors: Craig Schultz, Fremont, CA (US); Joshua Oen, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 688 days.

(21) Appl. No.: 10/033,429

(22) Filed: Dec. 27, 2001

(65) Prior Publication Data
US 2004/0209578 A1 Oct. 21, 2004

(51) Int. Cl.
*H04B 10/00* (2006.01)

(52) U.S. Cl. .............. 398/163; 398/182; 398/183; 398/186; 398/192; 398/194; 398/135; 398/136; 398/138; 398/154; 398/155; 398/164; 361/737; 361/816; 361/818; 361/800; 361/752; 361/753; 174/50; 174/51; 174/35 R; 174/35 GC

(58) Field of Classification Search .......... 398/180, 398/186, 135, 138, 154, 155, 163, 183, 192, 398/194, 164, 182, 136; 361/737, 818, 816, 361/800, 752, 753; 174/50, 51, 35 R
See application file for complete search history.

(56) References Cited

U.S. PATENT DOCUMENTS

| 5,353,201 A * | 10/1994 | Maeda ................. 361/816 |
| 5,557,142 A | 9/1996 | Gilmore et al. |
| 6,239,359 B1 * | 5/2001 | Lilienthal et al. ...... 174/35 GC |
| 6,271,465 B1 | 8/2001 | Lacey |
| 6,687,135 B1 * | 2/2004 | Kitade ................. 361/816 |
| 2001/0021051 A1 * | 9/2001 | Kim ..................... 359/161 |
| 2002/0080593 A1 * | 6/2002 | Tsuge et al. .......... 361/818 |

* cited by examiner

*Primary Examiner*—Hanh Phan
(74) *Attorney, Agent, or Firm*—Kevin A. Reif

(57) ABSTRACT

A transmitter comprises an oscillator, a phase lock loop, a serializer, and an electrical-to-optical converter. The oscillator is enclosed in a metal shield. The metal shield is soldered to a ground ring of the printed circuit board. In one embodiment, the oscillator is voltage-controlled oscillator.

4 Claims, 4 Drawing Sheets

EMI SHIELD FOR REDUCING CLOCK JITTER OF A TRANSCEIVER

BACKGROUND OF THE INVENTION

1. Field of the Invention

The described invention relates to the field of high speed optical components. In particular, the invention relates to reducing clock jitter on a high speed optical transmitter.

2. Description of Related Art

An optical transceiver comprises a receiver and transmitter. The transmitter serializes data, converts it from electrical to optical, and transmits the optical data at speeds of 10 Gbps. At these high speeds, electromagnetic interference (EMI) from components of the transmitter can cause excessive clock jitter that may lead to data errors.

DETAILED DESCRIPTION

An apparatus and method for reducing clock jitter on a high speed optical transmitter is described. The transmitter comprises an oscillator, a phase lock loop, a serializer, and an electrical-to-optical converter. The oscillator is enclosed in a metal shield to reduce the clock jitter. In one embodiment, the metal shield is soldered to a ground ring of a printed circuit board.

Figure 1:
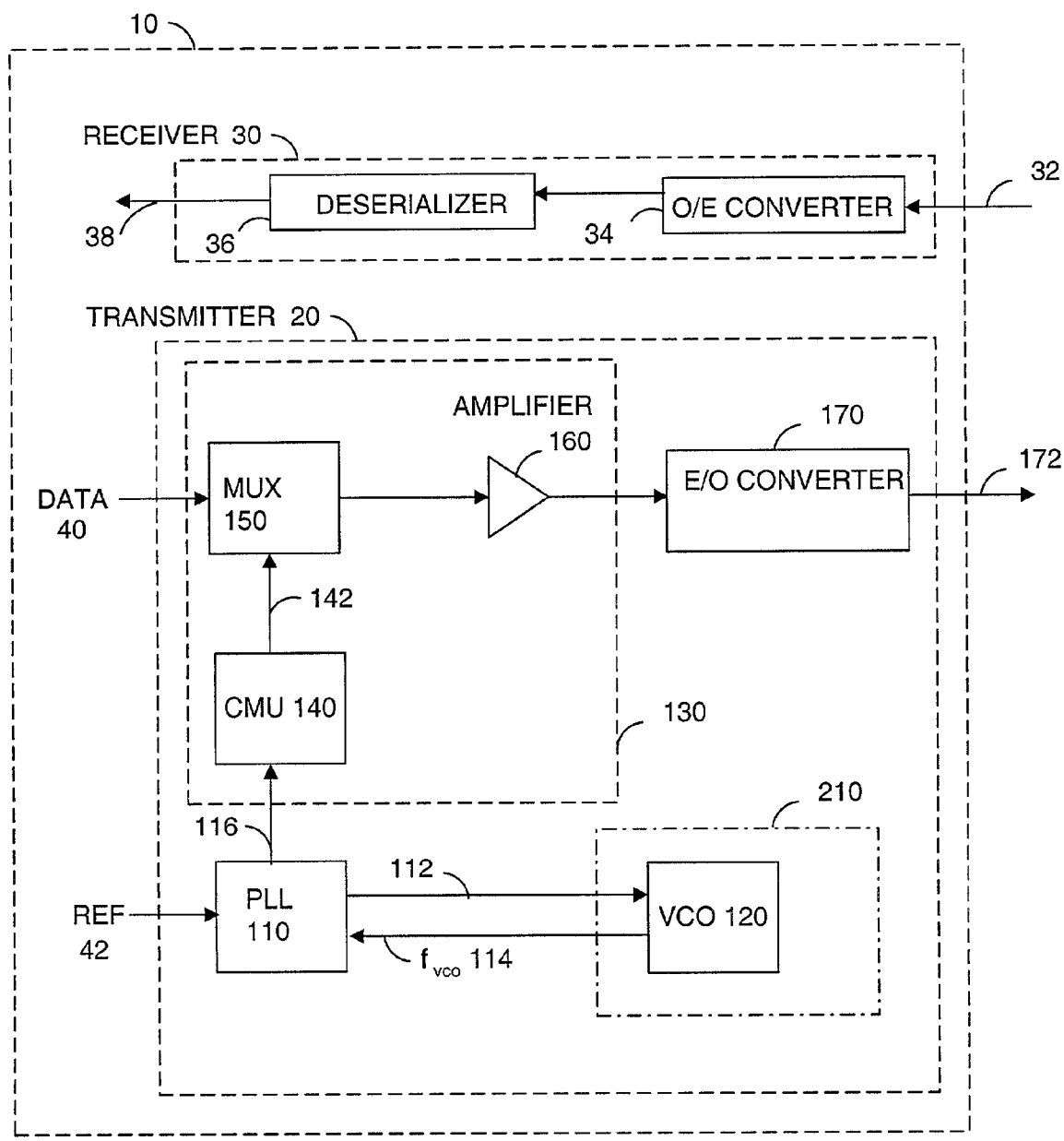
FIG. 1 is a schematic diagram showing one embodiment of a transceiver.

FIG. 1 is a schematic diagram showing one embodiment of a transceiver 10. The transceiver 10 comprises a transmitter 20 and a receiver 30. The receiver 30 receives optical data 32, converts it to electrical data 36 via an optical-to-electrical converter 34, and deserializes the electrical data with a deserializer 36 to provide an electrical signal 38. The transmitter 20 receives electrical data 40, converts it to optical signals and sends the optical data 172 out via an optical interconnect, such as an optical fiber.

The transmitter 20 comprises a phase lock loop (PLL) 110, an oscillator 120, a serializer 130, and an electrical-to-optical converter 170. In one embodiment, the oscillator 120 is a voltage-controlled oscillator (VCO). The PLL 110 receives a reference input 42 and provides a voltage 112 to the VCO 120. The VCO 120 provides a frequency signal $f_{vco}$ 114 to the PLL 110, and the PLL 110 provides a clock signal 116 to the serializer 130.

In one embodiment, the serializer 130 comprises a clock multiplier unit (CMU) 140, a multiplexer 150 and an amplifier 160. The CMU 140 multiplies the clock signal provided to it by the PLL 110, and provides the multiplied clock signal to the multiplexer (MUX) 150 which serializes input data 40. In one embodiment, the MUX 150 is a 16:1 multiplexer, and the CMU 140 multiplies the clock signal 116 by 16 to yield a 10 GHz clock signal 142. The output of the MUX 150 is amplified by amplifier 160 and provided to the electrical-to-optical converter 170, which then sends out the optical data 172.

Clock jitter generated in the transceiver 10 is a composite of inherent clock jitter based on the quality of the reference signal and the oscillator 120 and PLL 110, as well as noise such as pattern-dependent noise from, e.g., the switching of the MUX 150. Clock jitter may cause data reliability problems if the jitter is too high. A metal shield 210 is placed around the oscillator 120 to reduce the clock jitter. The metal shield combined with a ground plane, as will be described with respect to FIGS. 2 and 3, form a Faraday cage around the oscillator 120. This reduces the electromagnetic interference (EMI) of other components from interfering with the oscillator 120, which results in reduced clock jitter for the transmitter.

Figure 2:
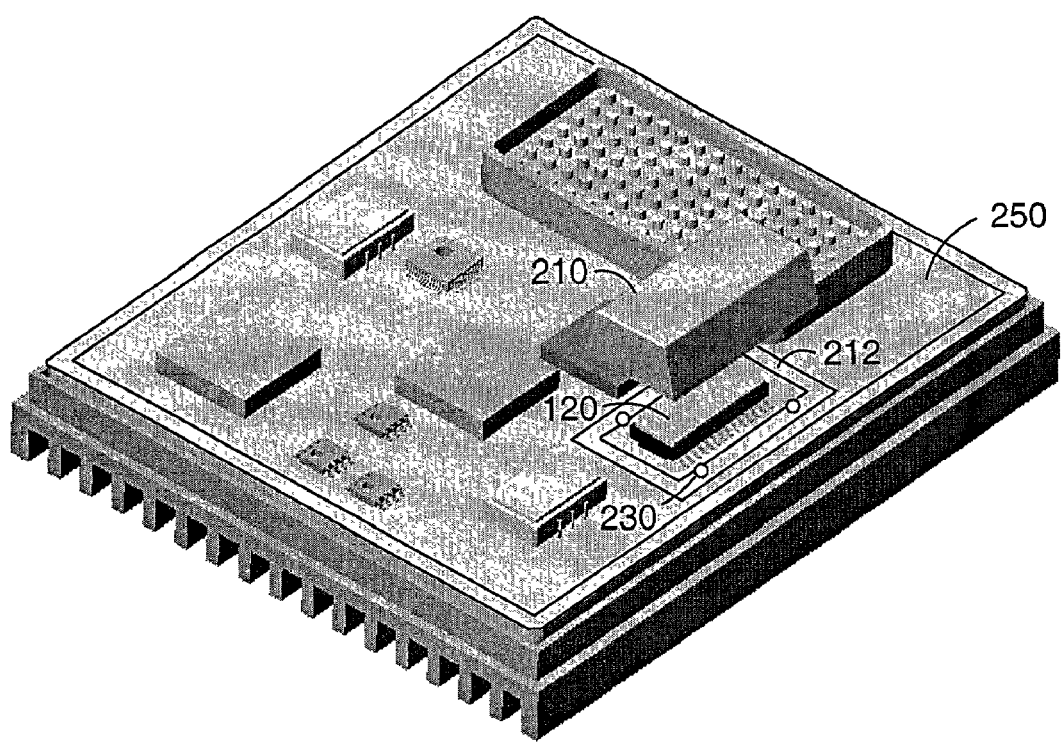
FIG. 2 is a 3-D diagram of a transceiver showing a metal shield 210 positioned to cover the oscillator 120.

FIG. 2 is a 3-D diagram of a transceiver showing a metal shield 210 positioned to cover the oscillator 120. A ground ring 212 on the printed circuit board (PCB) 250 surrounds the oscillator and is coupled to one or more ground planes of the PCB 250. In one embodiment, the ground ring 212 is coupled to the ground planes through vias in the PCB 250. In one embodiment, two or more holes 230 are used to help align the metal shield 210 as will be discussed below.

Figure 3:
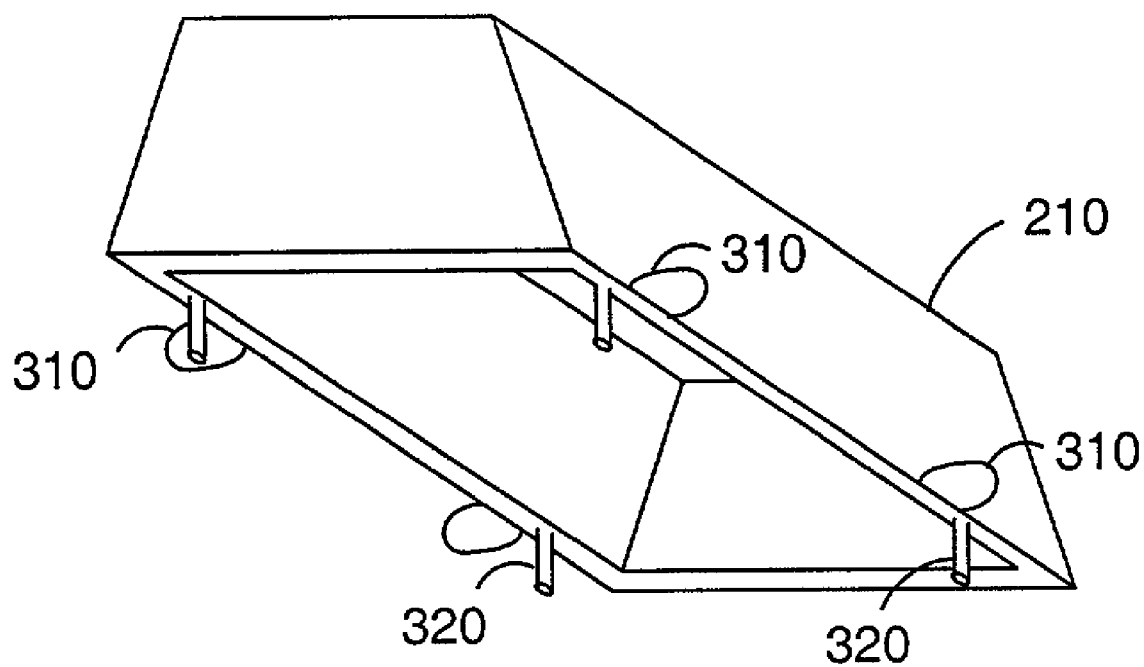
FIG. 3 is a 3-D diagram that shows one example of a metal shield.

FIG. 3 is a 3-D diagram that shows one example of a metal shield 210. In one embodiment, the metal shield 210 has a plurality of protrusions. Attachment protrusions 310 allow the metal shield to be coupled to the ground ring and the printed circuit board. In one embodiment, the metal shield is soldered to the ground ring via the attachment protrusions 310. In another embodiment, the attachment protrusions 310 may feature a hole that allows a screw to hold the metal shield 210 to the printed circuit board.

Positioning protrusions 320 allow the metal shield to be aligned properly on the printed circuit board. In one embodiment, the positioning protrusions 320 are inserted into holes 230 (FIG. 2) in the printed circuit board.

Figure 4:
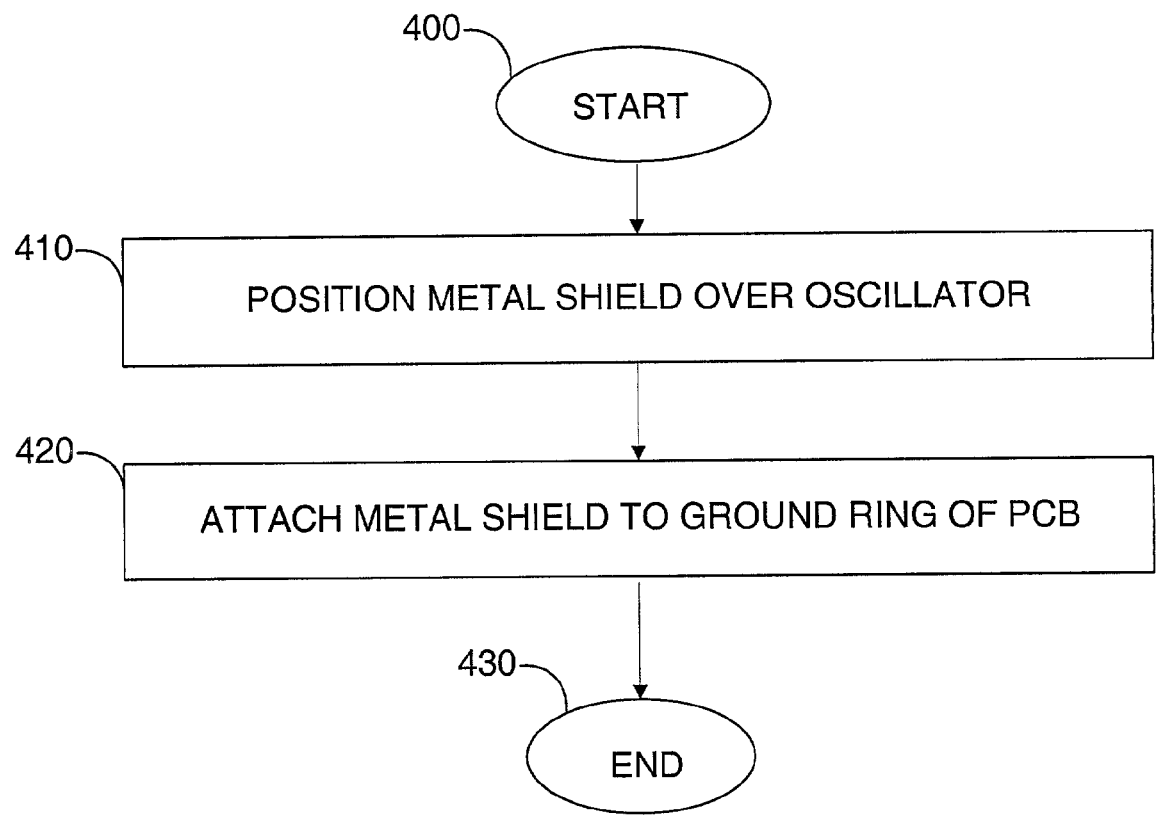
FIG. 4 is a flowchart that shows one method of shielding an oscillator.

FIG. 4 is a flowchart that shows one method of shielding an oscillator. The flowchart starts at block 400 and continues at block 410, at which the metal shield is positioned over the oscillator. In one embodiment, positioning protrusions 320 are used to help align the metal shield to the desired location by inserting the positioning protrusions 320 into holes 230 (FIG. 2) in the printed circuit board.

The flowchart continues at block 420, at which the metal shield is attached to the ground ring 212 (FIG. 2) of the printed circuit board. The metal shield may be attached in a variety of ways, including solder and/or conductive epoxy. In one embodiment, a conductive gasket is placed between the bottom of the metal shield and the ground ring to establish a good electrical connection, and the metal shield is compressed against the conductive gasket by, e.g., screws. The flowchart ends at block 430.

Thus, an apparatus and method for reducing clock jitter on a high speed optical transmitter is disclosed. However, the specific embodiments and methods described herein are merely illustrative. Numerous modifications in form and detail may be made without departing from the scope of the invention as claimed below. The invention is limited only by the scope of the appended claims.

What is claimed is:

1. A transmitter comprising:

an oscillator enclosed in a metal shield;

a Phase Lock Loop (PLL) coupled to the oscillator;

a serializer coupled to receive a clock signal from the PLL and to provide serial data; and an electrical-to-optical converter coupled to the serializer to convert the serial data to optical signals, wherein the metal shield is soldered to a ground ring on a printed circuit board, wherein the metal shield comprises:

one or more positioning protrusions perpendicular to the printed circuit board that enter into holes in the printed circuit board; and one or more attachment protrusions parallel to the printed circuit board for soldering the metal shield to the ground ring.

2. The transmitter of claim 1, wherein the ground ring is electrically coupled to one or more ground planes of the printed circuit board.

3. The transmitter of claim 1, wherein the metal shield is comprised at least partially of copper.

4. The transmitter of claim 1, wherein the oscillator is a voltage-controlled oscillator.

* * * * *